(12) United States Patent
Long et al.

(10) Patent No.: US 11,309,392 B2
(45) Date of Patent: Apr. 19, 2022

(54) THIN FILM TRANSISTOR AND METHOD FOR MANUFACTURING THE SAME, AND DISPLAY PANEL

(71) Applicant: BOE Technology Group Co., Ltd., Beijing (CN)

(72) Inventors: Chunping Long, Beijing (CN); Hui Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 173 days.

(21) Appl. No.: 16/863,253

(22) Filed: Apr. 30, 2020

(65) Prior Publication Data

US 2021/0005726 A1  Jan. 7, 2021

(30) Foreign Application Priority Data

Jul. 2, 2019 (CN) .......................... 201921028781.X

(51) Int. Cl.
| | |
|---|---|
| *G09G 3/30* | (2006.01) |
| *H01L 29/417* | (2006.01) |
| *H01L 27/12* | (2006.01) |
| *H01L 29/786* | (2006.01) |
| *H01L 29/66* | (2006.01) |
| *G09G 3/3266* | (2016.01) |
| *H01L 27/32* | (2006.01) |

(52) U.S. Cl.
CPC ..... *H01L 29/41733* (2013.01); *G09G 3/3266* (2013.01); *H01L 27/124* (2013.01); *H01L 27/1222* (2013.01); *H01L 27/1255* (2013.01); *H01L 27/1274* (2013.01); *H01L 29/41758* (2013.01); *H01L 29/66757* (2013.01); *H01L 29/78675* (2013.01); *G09G 2300/0809* (2013.01); *G09G 2310/0286* (2013.01); *H01L 27/3262* (2013.01)

(58) Field of Classification Search
CPC combination set(s) only.
See application file for complete search history.

(56) References Cited

U.S. PATENT DOCUMENTS

2012/0305930 A1* 12/2012 Makita ................ H01L 27/1288
257/72
2016/0340233 A1* 11/2016 Jin .......................... B32B 15/08

* cited by examiner

*Primary Examiner* — Insa Sadio
(74) *Attorney, Agent, or Firm* — Nath, Goldberg & Meyer; Joshua B. Goldberg

(57) ABSTRACT

The present disclosure provides a thin film transistor, a display panel and a method for manufacturing the thin film transistor. The thin film transistor includes an active layer and a source-drain electrode layer, the source-drain electrode layer includes a first electrode having at least one first electrode strip and a second electrode having at least one second electrode strip, the at least one first electrode strip and the at least one second electrode strip are alternately arranged at intervals, and at least an insulating part of a layer where the active layer is located is provided with an insulating material, and the insulating part is located at an orthographic projection of at least a part of a region between a free end of the first electrode strip, which is proximal to the second electrode, and the second electrode, on the layer where the active layer is located.

19 Claims, 8 Drawing Sheets

A1

THIN FILM TRANSISTOR AND METHOD FOR MANUFACTURING THE SAME, AND DISPLAY PANEL

CROSS-REFERENCE TO RELATED APPLICATION

This application claims the priority from the Chinese Patent Application No. 201921028781.x, filed on Jul. 2, 2019, in the Chinese Intellectual Property Office, the disclosure of which is incorporated herein in its entirety by reference.

TECHNICAL FIELD

The present disclosure relates to the field of display technology, and particularly, to a thin film transistor, a display panel including the thin film transistor, and a method for manufacturing the thin film transistor.

BACKGROUND

A Thin-film transistor (TFT) generally includes a gate electrode, an active layer, and a source electrode and a drain electrode in the same layer, which are stacked, the source electrode and the drain electrode are electrically coupled to the active layer, and when a valid level signal is input to the gate electrode, the TFT is turned on, and the source electrode and the drain electrode may be conducted through the active layer.

SUMMARY

The present disclosure provides a thin film transistor, a display panel and a method for manufacturing the thin film transistor.

As a first aspect of the present disclosure, a thin film transistor is provided to include an active layer and a source-drain electrode layer, the active layer is made of a semiconductor material, the source-drain electrode layer includes a first electrode and a second electrode, the first electrode includes at least one first electrode strip, the second electrode includes at least one second electrode strip, the at least one first electrode strip and the at least one second electrode strip are alternately arranged at intervals, at least an insulating part of a layer where the active layer is located is provided with an insulating material, and the insulating part is located at an orthographic projection of at least a part of a region between a free end of the first electrode strip, which is proximal to the second electrode, and the second electrode, on the layer where the active layer is located; and/or at least an insulating part of a layer where the active layer is located is provided with an insulating material, and the insulating part is located at an orthographic projection of at least a part of a region between a free end of the second electrode strip, which is proximal to the first electrode, and the first electrode, on the layer where the active layer is located.

In an embodiment, the first electrode further includes at least one first conductive connecting strip, the first electrode includes a plurality of first electrode strips, and the plurality of first electrode strips of the first electrode are electrically coupled to each other by the first conductive connecting strip.

In an embodiment, the second electrode includes at least one second conductive connecting strip, the second electrode includes a plurality of second electrode strips, and the plurality of second electrode strips of the second electrode are electrically coupled to each other by the at least one second conductive connecting strip; and the at least one first conductive connecting strip and the at least one second conductive connecting strip are arranged in parallel.

In an embodiment, the at least one first conductive connecting strip includes one first conductive connecting strip and the at least one second conductive connecting strip includes two second conductive connecting strips; the two second conductive connecting strips are respectively arranged on two sides of the first conductive connecting strip; and the plurality of first electrode strips respectively arranged on two sides of the first conductive connecting strip, and the plurality of second electrode strips are respectively arranged on one side, facing the first conductive connecting strip, of the two second conductive connecting strips.

In an embodiment, at least an insulating part of a layer where the active layer is located is provided with an insulating material, and the insulating part is located at an orthographic projection of at least a part of a region between a free end of the first electrode strip, which is proximal to the second electrode, and its opposite second conductive connecting strip, on the layer where the active layer is located; and/or at least an insulating part of a layer where the active layer is located is provided with an insulating material, and the insulating part is located at an orthographic projection of at least a part of a region between a free end of the second electrode strip, which is proximal to the first electrode, and the first conductive connecting strip, on the layer where the active layer is located.

In an embodiment, a region of the layer where the active layer is located is provided with an insulating material, the region is within a first predetermined distance from an orthographic projection of at least one of two sides of the first conductive connecting strip on the layer where the active layer is located, and the first predetermined distance is a distance between a free end of the second electrode strip and its opposite first conductive connecting strip; and/or a region of the layer where the active layer is located is provided with an insulating material, the region is within a second predetermined distance from an orthographic projection of a side, proximal to the first conductive connecting strip, of at least one of the two conductive connecting strips on the layer where the active layer is located, and the second predetermined distance is a distance between a free end of the first electrode strip and its opposite second conductive connecting strip.

In an embodiment, the thin film transistor further includes a conductive strip, and the two second conductive connecting strips are electrically coupled to the conductive strip on one side of a direction in which the two second conductive connecting strips extend.

In an embodiment, the first electrode includes one first conductive connecting strip and four first electrode strips, two first electrode strips of the four first electrode strips are arranged on one side of the first conductive connecting strip, and the other two first electrode strips of the four first electrode strips are arranged on the other side of the first conductive connecting strip; and the second electrode includes two second electrode strips, the two second electrode strips are respectively arranged on two sides of the first conductive connecting strip, and each of the two second electrode strips is inserted between the two first electrode strips on its side.

In an embodiment, a part of the layer where the active layer is located corresponding to an orthographic projection of at least a portion of a region between the second electrode strip and the first conductive connecting strip thereon is provided with an insulating material.

In an embodiment, the orthographic projection of at least a part of a region between a free end of the first electrode strip, which is proximal to the second electrode, and the second electrode, on the layer where the active layer is located and/or the orthographic projection of at least a part of a region between a free end of the second electrode strip, which is proximal to the first electrode, and the first electrode, on the layer where the active layer is located is a rectangular orthographic projection.

In an embodiment, the thin film transistor further includes a gate electrode, an orthogonal projection of which on the layer where the active layer is located partially overlaps with the rectangular orthogonal projection.

In an embodiment, the thin film transistor further includes a gate insulating layer of a same material as the insulating material.

As a second aspect of the present disclosure, a display panel is provided to include a plurality of thin film transistors, and at least one thin film transistor of the plurality of thin film transistors is the above thin film transistor.

In an embodiment, the display panel includes a plurality of pixel units, at least one of the plurality of pixel units includes a pixel circuit having the at least one thin film transistor, and the first electrode functions as a source electrode and the second electrode functions as a drain electrode.

In an embodiment, the first electrode includes one first conductive connecting strip and four first electrode strips, two first electrode strips of the four first electrode strips are arranged on one side of the first conductive connecting strip, and the other two first electrode strips of the four first electrode strips are arranged on the other side of the first conductive connecting strip; the second electrode includes two second electrode strips, the two second electrode strips are respectively arranged on two sides of the first conductive connecting strip, and each of the two second electrode strips is inserted between the two first electrode strips on its side; and the first electrode is electrically coupled to a data line by the first conductive connecting strip, and the second electrode is electrically coupled to a pixel electrode by a conductive part.

In an embodiment, the display panel further includes a gate drive circuit including a plurality of cascaded shift register units, which include the at least one thin film transistor; and the second electrode functions as a source electrode, and the first electrode functions as a drain electrode.

As a third aspect of the present disclosure, a method for manufacturing the above thin film transistor is provided to include forming a pattern of an active layer on a substrate, so that at least an insulating part of a layer where the active layer is located is provided with an insulating material, and the insulating part is located at an orthographic projection of at least a part of a region between a free end of the first electrode strip, which is proximal to the second electrode, and the second electrode, on the layer where the active layer is located; and/or at least an insulating part of a layer where the active layer is located is provided with an insulating material, and the insulating part is located at an orthographic projection of at least a part of a region between a free end of the second electrode strip, which is proximal to the first electrode, and the first electrode, on the layer where the active layer is located.

In an embodiment, the forming a pattern of an active layer on a substrate includes forming a semiconductor material layer on the substrate, and forming, by a patterning process, a via hole in the semiconductor material layer at at least the insulating part of the layer where the active layer is located; and the method further includes filling the via hole with the insulating material, flattening the insulating material in the via hole and forming a gate insulating layer.

In an embodiment, the forming a pattern of an active layer on a substrate includes forming a semiconductor material layer on the substrate, and forming a via hole in the semiconductor material layer at at least the insulating part of the layer where the active layer is located by a patterning process; and the method further includes depositing a gate insulating layer material directly after forming the via hole to form a pattern of a gate insulating layer while filling the via hole with the gate insulating layer material.

BRIEF DESCRIPTION OF THE DRAWINGS

The accompanying drawings, which are included to provide a further understanding of the present disclosure and constitute a part of this specification, illustrate embodiments of the present disclosure and serve to explain the present disclosure together with the following description. However, the present disclosure is not limited thereto. In the drawings.

DETAILED DESCRIPTION OF THE EMBODIMENTS

Figure 1:
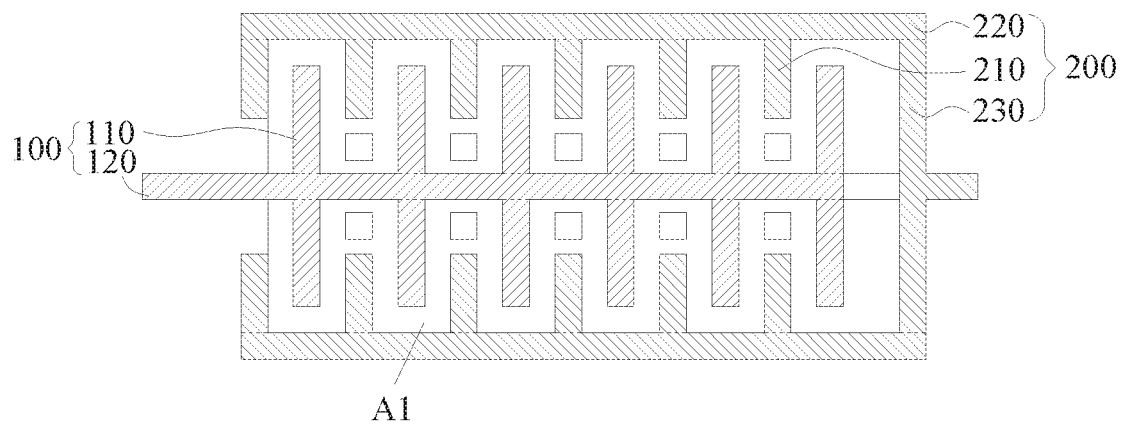
FIG. 1 is a schematic structural diagram of a thin film transistor provided by an embodiment of the present disclosure.
Figure 2:
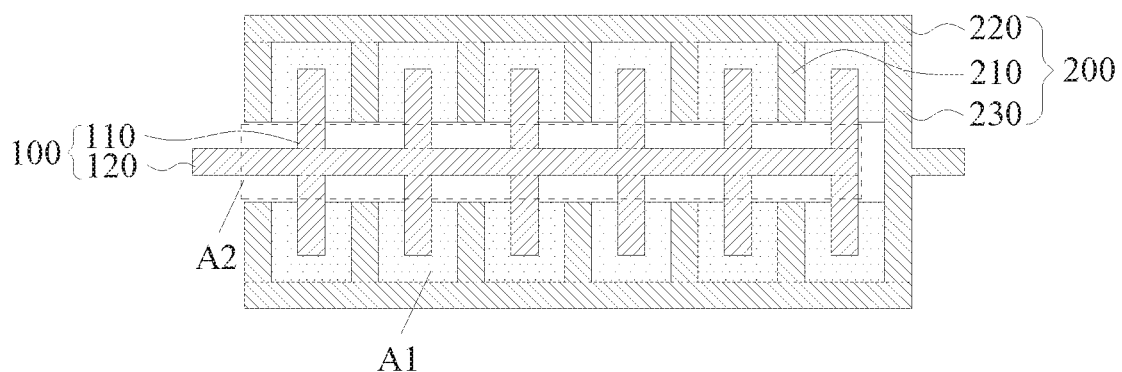
FIG. 2 is a schematic structural diagram of a thin film transistor provided by an embodiment of the present disclosure.

The following detailed description of the embodiments of the present disclosure will be given together with the accompanying drawings. It should be understood that, the detailed description and specific examples are given by way of illustration and explanation only, not limitation.

A thin film transistor in the related art generally has a problem of excessive local heat during a long time operation, resulting in damage to the thin film transistor.

In order to achieve the above object, the present disclosure provides a thin film transistor, as shown in FIGS. 1 to 8, the thin film transistor includes an active layer and a source/drain electrode layer, the active layer is made of a semiconductor material, the source/drain electrode layer includes a first electrode 100 and a second electrode 200, the first electrode 100 includes at least one first electrode strip 110, the second electrode 200 includes at least one second electrode strip 210, the at least one first electrode strip 110 and the at least one second electrode strip 210 are alternately arranged at intervals, a free end of the first electrode strip 110 faces the second electrode 200, and a free end of the second electrode strip 210 faces the first electrode 100.

At least an insulating part of a layer where the active layer is located is not provided with the semiconductor material, but with an insulating material, and the insulating part is located at an orthographic projection of at least a part of a region between a free end of the at last one first electrode strip 110, which is proximal to the second electrode 200, and the second electrode 200, on the layer where the active layer is located not provided with a semiconductor material, but is provided with an insulating material; and/or A part of the layer where the active layer is located, at the orthographic projection of an area between a free end of the at least one second electrode strip 210 and the first electrode 100 on the layer where the active layer is located, is not provided with semiconductor material.

Note that, at least a partial region of the semiconductor material of the active layer is opposite to regions of the first electrode and the second electrode of the source/drain electrode layer in a thickness direction (i.e. in a direction perpendicular to the substrate of the thin film transistor). It is easily understood that, the first electrode 100 and the second electrode 200 serve as a source electrode and a drain electrode, respectively, in the thin film transistor. For example, the thin film transistors shown in FIGS. 1 to 3 and 5 to 6 may be applied to a shift register (GOA) circuit, in which the second electrode 200 serves as a source electrode and the first electrode 100 serves as a drain electrode; the thin film transistor shown in FIGS. 4 and 8 may be applied to a pixel circuit in which the first electrode 100 serves as a source electrode to be coupled to a data line 500 and the second electrode 200 serves as a drain electrode to be coupled to a pixel electrode 600.

When the first electrode 100 includes a plurality of first electrode strips 110, the plurality of first electrode strips 110 are electrically coupled to each other, and when the second electrode 200 includes a plurality of second electrode strips 210, the plurality of second electrode strips 210 are electrically coupled to each other. The plurality of first electrode strips 110 and the plurality of second electrode strips 210 are alternately arranged at intervals, for example, the plurality of first electrode strips 110 and the plurality of second electrode strips 210 may be interdigitated electrode strips, that is, the free end of the first electrode strip 110 may be inserted between two opposite adjacent second electrode strips 210, and the free end of the second electrode strip 210 may be inserted between two opposite adjacent first electrode strips 110, so that the current between the first electrode 100 and the second electrode 200 is dispersed between the respective first electrode strips 110 and second electrode strips 210, thereby alleviating the heating problem caused by the current convergence between the first electrode 100 and the second electrode 200 without increasing the size of the first electrode 100 and the second electrode 200.

In order to further reduce current flowing through the free end of each first electrode strip 110 and/or the free end of each second electrode strip 210, in the present disclosure, a position where the current is easily concentrated between the first electrode 100 and the second electrode 200 is further improved. Positions where current is likely to concentrate include: a position between the free end of each first electrode strip 110 and the second electrode 200 which the free end of the first electrode strip 110 faces (i.e. between the first electrode strip 110 and the second conductive connecting strip 220 which the first electrode strip 110 faces (the second conductive connection strip 220 opposite to the first electrode strip 110) in the figures), and a position between the free end of each second electrode strip 210 and the first electrode 100 which the fee end of the second electrode strip 210 faces (i.e. between the second electrode strip 210 and the first conductive connecting strip 120 which the second electrode strip 210 faces (the first conductive connection strip 120 opposite to the second electrode strip 210) in the figures).

In the present disclosure, in the layer where the active layer is located, the above positions where current is likely to concentrate are not provided with the semiconductor material, but with an insulating material (for example, an insulating material which may be for a gate insulating layer). As shown in FIGS. 1 to 8, the first region A1 of the layer where the active layer is located is a region where the semiconductor material is provided to correspond to the first electrode strip 110 and the second electrode strip 210. A hole-shaped blank area in the first region A1, a blank area between an edge of the first region A1 and an edge of an orthographic projection of the second electrode strip 210 on the layer where the active layer is located, and a blank area between two adjacent first regions A1 are areas, of the layer where the active layer is located, which are not provided with the semiconductor material.

With the above design of the first region A1 provided with the semiconductor material and the areas not provided with the semiconductor material, i.e., at least an insulating part of a layer where the active layer is located is provided with an insulating material, and the insulating part is located at an orthographic projection of at least a part of a region between a free end of the first electrode strip, which is proximal to the second electrode, and the second electrode, on the layer where the active layer is located; and/or at least an insulating part of a layer where the active layer is located is provided with an insulating material, and the insulating part is located at an orthographic projection of at least a part of a region between a free end of the second electrode strip, which is proximal to the first electrode, and the first electrode, on the layer where the active layer is located, current may not concentrate at the end of each first electrode strip 110 and/or the end of each second electrode strip 210 in the present disclosure, thereby eliminating the problem that heat generates at the end of the first electrode strip 110 and/or the end of the second electrode strip 210, and further solving the problem that the thin film transistor structure is damaged due to the heat generated during the long-time operation of the thin film transistor.

The present disclosure does not particularly limit how the plurality of first electrode strips 110 are electrically coupled to each other when the first electrode 100 includes the plurality of first electrode strips 110. For example, optionally, as shown in FIGS. 1 to 8, the first electrode 100 further includes a first conductive connecting strip 120, the first electrode 100 includes the plurality of first electrode strips 110, and the plurality of first electrode strips 110 of the first electrode 100 are electrically coupled to each other by the first conductive connecting strip 120.

Similarly, the present disclosure does not specifically limit how the plurality of second electrode strips 210 are electrically coupled to each other when the second electrode 200 includes the plurality of second electrode strips 210. For example, when the thin film transistor of the present disclosure is applied to a shift register circuit (i.e., a GOA circuit). Optionally, as shown in FIGS. 1 to 3 and 5 to 7, the second electrode 200 includes at least one second conductive connecting strip 220, the second electrode 200 includes a plurality of second electrode strips 210, and the plurality of second electrode strips 210 of the second electrode 200 are electrically coupled to each other by the second conductive connecting strip 220.

The first conductive connecting strip 120 is disposed in parallel with the second conductive connecting strip 220.

In order to further disperse current on the first conductive connecting strip 120 without increasing a length of the first conductive connecting strip 120, as shown in FIGS. 1 to 3 and 5 to 7, the plurality of first electrode strips 110 are respectively disposed on both sides of the first conductive connecting strip 120; the second electrode 200 includes two second conductive connecting strips 220, the two second conductive connecting strips 220 are respectively disposed at two sides of the first conductive connecting strip 120, and each second conductive connecting strip 220 is provided with a plurality of second electrode strips 210. Specifically, as shown in FIG. 1, a plurality of first electrode strips 110 are provided on each side of the first conductive connecting strip 120 to extend towards the opposite second conductive connecting strip 220, a plurality of second electrode strips 120 are provided on a side of the second conductive connecting strip 120 proximal to the first conductive connecting strip 120 to extend towards the first conductive connecting strip 120, and the plurality of first electrode strips 110 and the plurality of second electrode strips 120 are interdigitated electrode strips, that is, the free end of the first electrode strip 110 may be inserted between two opposite adjacent second electrode strips 210, and the free end of the second electrode strip 210 may be inserted between two opposite adjacent first electrode strips 110.

It should be noted that, when the second electrode 200 includes two second conductive connecting strips 220, the two second conductive connecting strips 220 are electrically coupled to each other. The present disclosure does not specifically limit how the two second conductive connecting strips 220 are electrically coupled to each other. For example, optionally, as shown in FIGS. 1 to 3 and 5 to 7, the second electrode 200 further includes a conductive strip 230, and the two second conductive connecting strips 220 are both electrically coupled to the conductive strip 230.

Among thin film transistors in a display panel, particularly in a pixel circuit, it is generally required that an area occupied by the thin film transistor is as small as possible. WITH the design that the two second conductive connecting strips 220 are respectively arranged on the two sides of the first conductive connecting strip 120, the effect of further dispersing the current on the first conductive connecting strip 120 on the premise of not increasing the length of the first conductive connecting strip 120 is realized.

When the thin film transistor of the present disclosure is applied in a shift register circuit, optionally, as shown in FIGS. 1 to 3 and 5 to 7, in the layer where the active layer is located, a region, where no semiconductor material is disposed, exists at a position corresponding to a portion between the first electrode strip 110 and the second conductive connecting strip 220 in the source/drain electrode layer.

Figure 4:
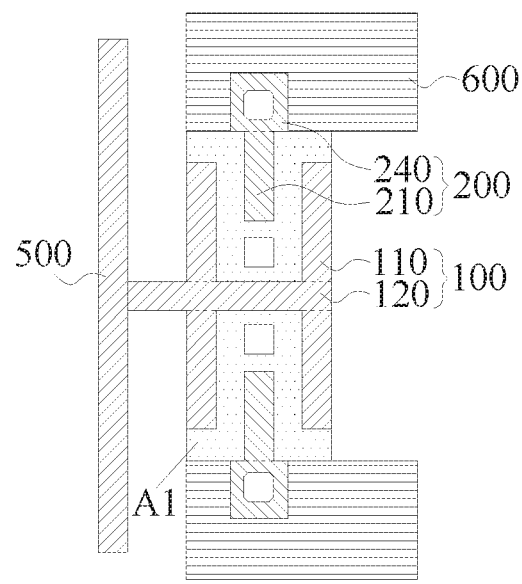
FIG. 4 is a schematic structural diagram of a thin film transistor provided by an embodiment of the present disclosure.
Figure 8:
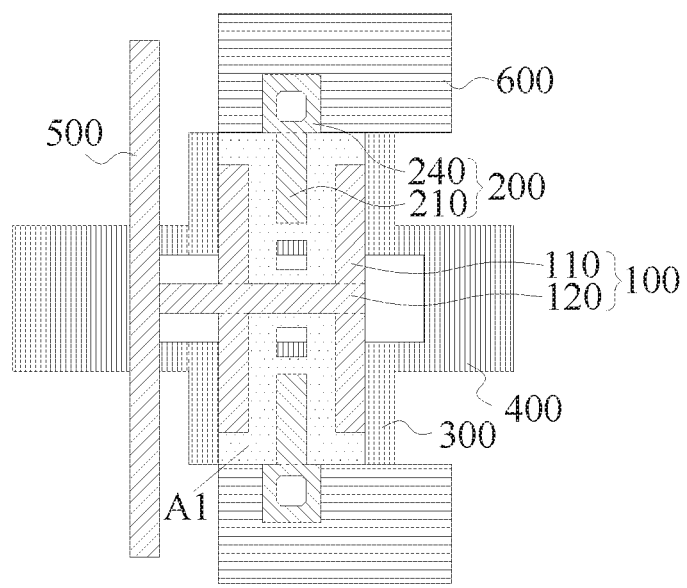
FIG. 8 is a schematic structural diagram of a thin film transistor provided by an embodiment of the present disclosure.

When the thin film transistor of the present disclosure is applied in a pixel circuit, optionally, as shown in FIGS. 4 and 8, the first electrode 100 includes four first electrode strips 110, and two of the four first electrode strips 110 are respectively disposed on each of two sides of the first conductive connecting strip 120; the second electrode 200 includes two second electrode strips 210, and the two second electrode strips 210 are respectively disposed at both sides of the first conductive connecting strip 120.

It is easily understood that, the first electrode 100 serves as a source electrode to be electrically coupled to a data line 500, and the second electrode 200 serves as a drain electrode to be electrically coupled to a pixel electrode 600, in FIGS. 4 and 8. Optionally, the second electrode 200 further includes a conductive part 240 for electrically coupling the second electrode strip 210 to the pixel electrode 600.

Figure 3:
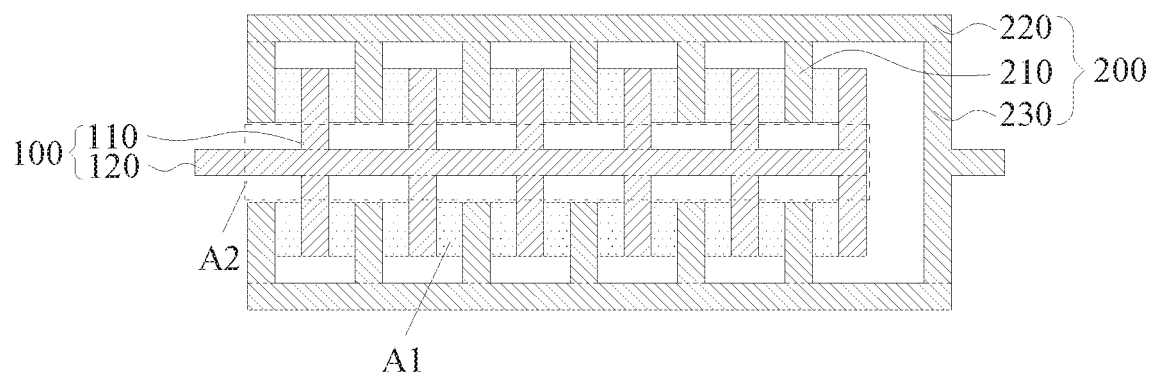
FIG. 3 is a schematic structural diagram of a thin film transistor provided by an embodiment of the present disclosure.
Figure 7:
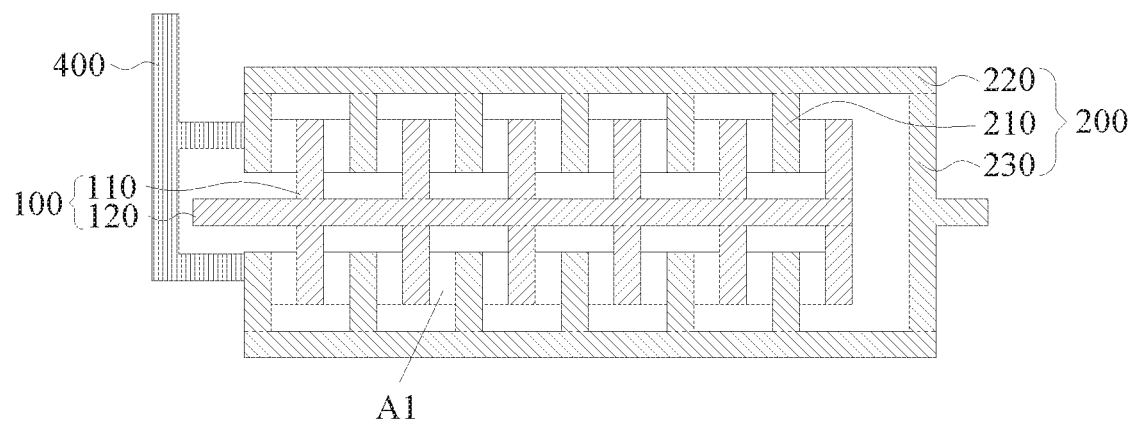
FIG. 7 is a schematic structural diagram of a thin film transistor provided by an embodiment of the present disclosure.

When the thin film transistor of the present disclosure is applied to a pixel circuit, optionally, as shown in FIGS. 3 and 7, in a layer where the active layer is located, a region where no semiconductor material is disposed is at a position corresponding to a portion between the second electrode strip 210 and the first conductive connecting strip 120.

The shape of the region where the semiconductor material is not provided in the layer where the active layer is located is not particularly limited in the present disclosure, and for example, as illustrated in FIGS. 1, 4, 5, and 8, the region where the semiconductor material is not provided is a rectangular region as an embodiment of the present disclosure.

In the present disclosure, the region of the active layer, where no semiconductor material is disposed, is designed to be rectangular, so it is possible to reduce the current between the free end of the second electrode strip 210 and the first conductive connecting strip 120 (or between the free end of the first electrode strip 110 and the second conductive connecting strip 220), and maintain the contact area between the first electrode strip 110 (or the second electrode strip 210) and the semiconductor material of the active layer, thereby maintaining the dispersion degree of the current between the first electrode 100 and the second electrode 200 as much as possible on the premise of reducing the heat generated in the thin film transistor.

Figure 5:
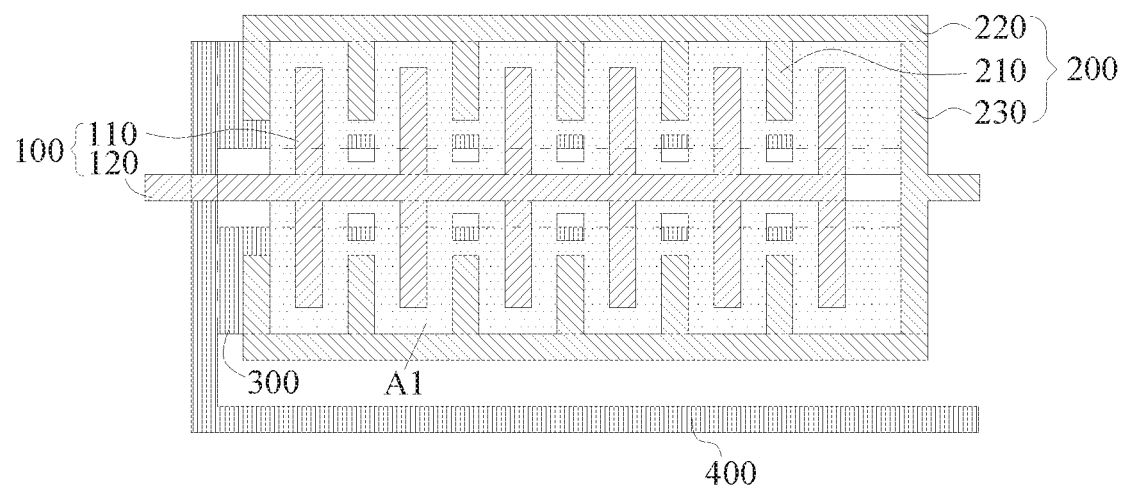
FIG. 5 is a schematic structural diagram of a thin film transistor provided by an embodiment of the present disclosure.
Figure 6:
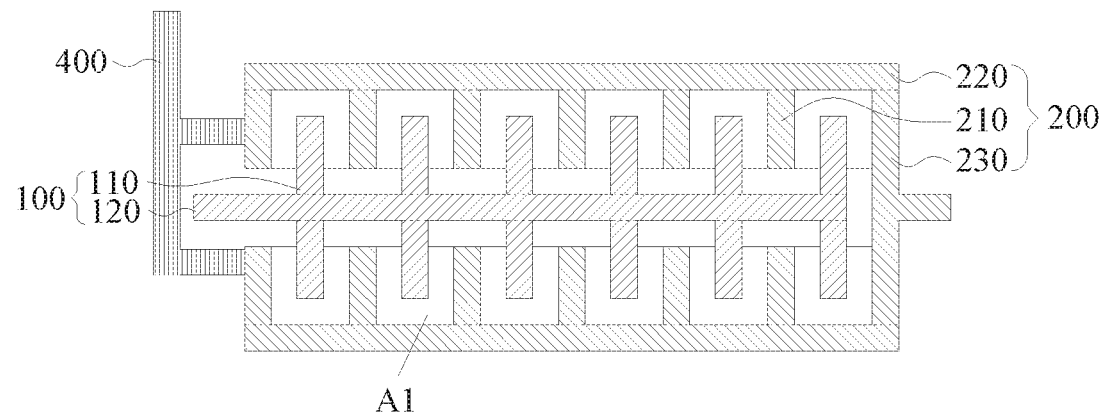
FIG. 6 is a schematic structural diagram of a thin film transistor provided by an embodiment of the present disclosure.

In order to maximize the area of the active layer where the semiconductor material is conducted while reducing current at the free end of the first electrode strip 110 or the second electrode strip 210, as shown in FIGS. 5 and 8, the thin film transistor further includes a gate electrode 300, and an orthographic projection of the gate electrode 300 on the layer where the active layer is located at least partially overlaps with the rectangular region where the semiconductor material is not provided.

The present disclosure does not specifically limit other film layers and structures of the thin film transistor, for example, as shown in FIGS. 5 to 8, the thin film transistor further includes a gate line 400, and the gate line 400 is electrically coupled to the gate electrode 300 for supplying a switching signal to the gate electrode 300.

In order to simplify a pattern of the semiconductor material of the active layer and reduce the requirements for the manufacturing process of the thin film transistor, as one embodiment of the present disclosure, as shown in FIGS. 2 to 3 and 6 to 7, the region where the semiconductor material is not provided extends from one end of the first conductive connecting strip 120 to the other end of the first conductive connecting strip 120.

In the present disclosure, the region, of the layer where the active layer is located, without the semiconductor material is designed as a continuous opening (e.g., the second region A2 shown by a dashed box in FIGS. 2 to 3 and 6 to 7) in the layer, so that the corresponding relationship between each individual region, in the layer where the active layer is located, without the semiconductor material (e.g., the aforementioned rectangular region) and each first electrode strip 110 or each second electrode strip 210 does not need to be considered, i.e., the requirements of the process for aligning the region without the semiconductor material and the electrode strips do not exist.

That is, in the layer where the active layer is located, a region, at an orthographic projection of a region within a first predetermined distance from at least one of both sides of the first conductive connecting strip 120 on the layer where in the active layer is located, is not provided with the semiconductor material of the active layer but with an insulating material, the first predetermined distance being a distance between a free end of the second electrode strip 210 and the first conductive connecting strip 120 opposite thereto; and/or in the layer where the active layer is located, a region, at an orthographic projection of a region within a second predetermined distance from a side (close to the first conductive connecting strip 120) of at least one of the second conductive connecting strip 220 on the layer where in the active layer is located, is not provided with the semiconductor material of the active layer but with an insulating material, the second predetermined distance being a distance between a free end of the first electrode strip 110 and the second conductive connecting strip 220 opposite thereto.

Further, as shown in FIGS. 3 and 7, for a pattern of the semiconductor material corresponding to the first electrode strip 110 and the second electrode strip 210 on one side of the first conductive connecting strip 120, one edge of the pattern of the semiconductor material on one side facing the first conductive connecting strip 120 is aligned with the free end of the second electrode strip 210, and the other edge of the pattern of the semiconductor material on one side away from the first conductive connecting strip 120 is aligned with the free end of the first electrode strip 110.

With the above design, in the thin film transistor of the present disclosure current between the first electrode 100 and the second electrode 200 only passes through edges of the first electrode strip 110 and the second electrode strip 210 in the length direction, and current does not pass through the free ends of the first electrode strip 110 and the second electrode strip 210, thereby reducing heat generated by the current concentrated at the ends of the first electrode strip 110 and the second electrode strip 210.

Alternatively, as shown in FIGS. 1 to 8, the thin film transistor further includes a gate electrode 300. The gate electrode 300 corresponds to at least a portion of the layer in which the active layer is disposed, and the portion is provided with the semiconductor material.

As a second aspect of the present disclosure, there is also provided a display panel, including a plurality of thin film transistors, at least one of the plurality of thin film transistors being the thin film transistor described in the previous embodiment.

Optionally, the display panel includes a plurality of pixel units, a pixel circuit including at least one thin film transistor is disposed in each pixel unit, and at least one thin film transistor in the pixel circuit is the thin film transistor described in the above embodiment. The thin film transistor may be the thin film transistor as described above with reference to FIG. 4 or FIG. 8, which includes four first electrode strips 110 and two second electrode strips 210, the pixel unit further includes a pixel electrode 600, the two second electrode strips 210 of the second electrode 200 of the thin film transistor are electrically coupled to the pixel electrode 600 by the conductive part 240 thereof, and the first electrode 100 is coupled to the data line 500.

Optionally, the display panel further includes a shift register circuit, the shift register circuit includes a plurality of cascaded shift register units (i.e., GOA units), and the shift register unit includes a plurality of thin film transistors, where at least one thin film transistor is the thin film transistor described in the previous embodiment.

The display panel provided by the present disclosure includes the thin film transistor described in the previous embodiment, so the problem that the thin film transistor is damaged due to heat generated during a long-time operation of the thin film transistor and then the failure of the display panel is caused can be avoided.

Figure 17:
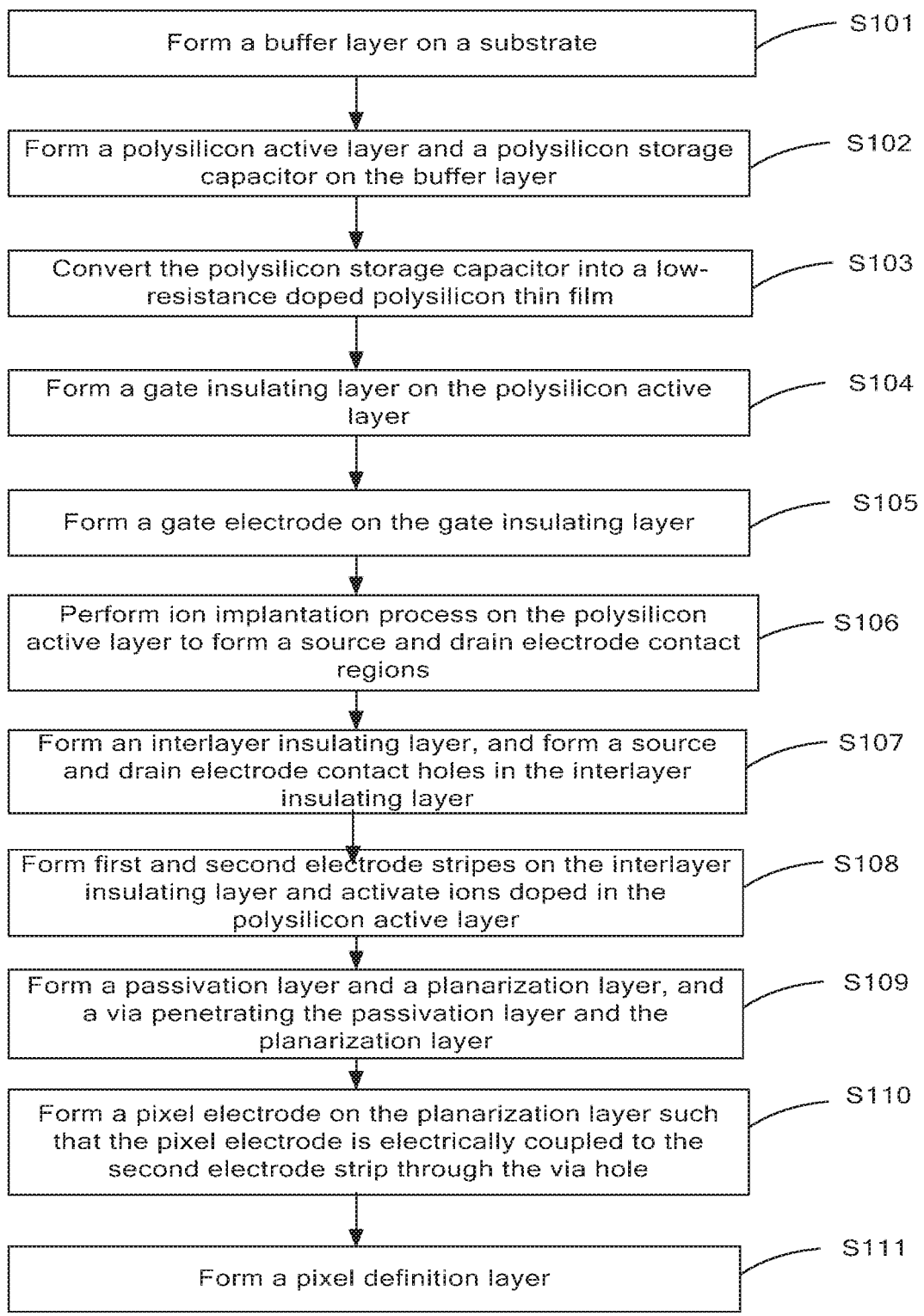
FIG. 17 is a flowchart of a method for manufacturing a thin film transistor provided by the present disclosure.

A method for manufacturing the thin film transistor provided by the present disclosure is provided. As shown in FIG. 17, the method includes: In step S101, as shown in FIG. 9, the buffer layer 2 is formed on the substrate 1.

The buffer layer 2 may be obtained by sequentially forming a silicon nitride (SiN) film and a silicon dioxide ($SiO_2$) film on the substrate 1 by a plasma enhanced chemical vapor deposition (PECVD) process.

Figure 9:
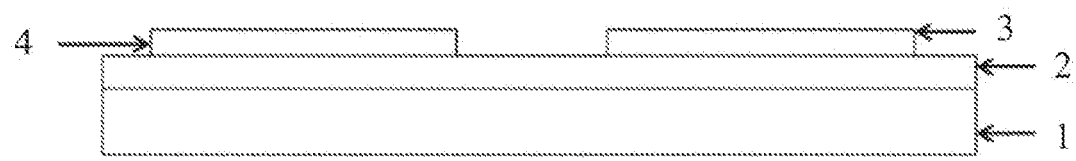
FIG. 9 is a schematic diagram illustrating a method for manufacturing a thin film transistor provided by the present disclosure.

In step S102, as shown in FIG. 9, a polysilicon active layer 4 and a polysilicon storage capacitor 3 are formed on the buffer layer 2, and the polysilicon active layer 4 is the above-mentioned active layer, and includes a semiconductor material.

The polysilicon active layer 4 and the polysilicon storage capacitor 3 may be obtained by forming a polysilicon film on the buffer layer 2 and performing a low-concentration ion doping process on the polysilicon film. Specifically, it may include:

forming an amorphous silicon (a-Si) film on the buffer layer 2 by a plasma enhanced chemical vapor deposition process or any other chemical or physical vapor deposition process; crystallizing the a-Si film into the polysilicon film by an ELA (Excimer Laser Anneal) or SPC (Solid Phase Crystallization) process; forming a pattern of a photoresist layer on the polysilicon film for example by a mask process; with the photoresist layer as an etching stop layer, etching a part of the polysilicon film which is not protected by the photoresist layer by plasma to form the polysilicon active layer 4 and the polysilicon storage capacitor 3; finally, performing the low-concentration ion doping on a transistor channel in the polysilicon active layer 4 such that a conductive channel required by the thin film transistor is formed in the polysilicon active layer 4.

In the thin film transistor to be manufactured in the present disclosure, in order to alleviate the heat generation problem caused by the current concentration at the end of the electrode strip, the pattern of the active layer needs to be formed to correspond to the patterns of the first and second electrodes of the source/drain electrode layer to be formed thereover, so that as described above: at least a part of a first region on the layer where the active layer is located, which corresponds to an orthographic projection of a region between the free end of the first electrode strip close to the second electrode and the second electrode on the layer where the active layer is located, is provided with an insulating material; and/or at least a part of a second region on the layer where the active layer is located, which corresponds to an orthographic projection of a region between the free end of the second electrode strip close to the first electrode and the second electrode on the layer where the active layer is located, is provided with an insulating material. For this reason, when the polysilicon active layer 4 is formed, at least a part of the layer where the active layer is located corresponding to the above-described first region and/or second region will not be provided with the semiconductor material, and a via hole, for example, which is rectangular in shape, is formed in the layer where the active layer is located by, for example, an etching process.

Figure 10:
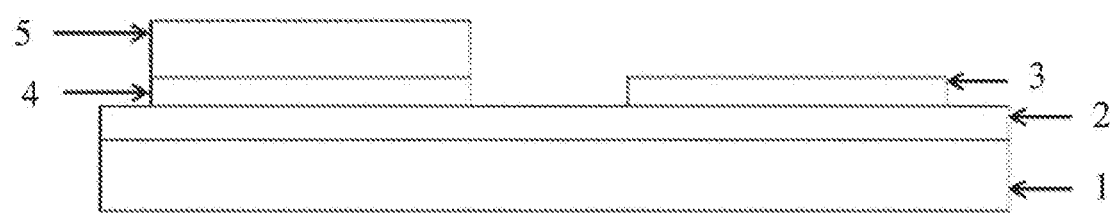
FIG. 10 is a schematic diagram illustrating a method for manufacturing a thin film transistor provided by the present disclosure.

In Step S103, the polysilicon storage capacitor 3 is converted into a low-resistance doped polysilicon film, which may specifically include:

As shown in FIG. 10, a photoresist pattern 5 made of a photoresist material is formed on the polysilicon active layer 4 by a mask process (to prevent the polysilicon active layer 4 from being implanted with ions); and a high-concentration ion implantation process is then performed on the polysilicon storage capacitor 3 without the protection of the photoresist pattern 5, and the polysilicon storage capacitor 3 is converted into a low-resistance doped polysilicon film.

It should be noted that, in the subsequent processes, only a gate insulating layer and a second plate of the capacitor formed by the gate electrode metal film are required to be formed on the polysilicon storage capacitor 3, which is not related to the manufacturing procedure of the thin film transistor of the present disclosure, so the only subsequent photolithography process (i.e., the photolithography process for forming the second plate of the capacitor) for the polysilicon storage capacitor 3 is not shown in the following.

Figure 11:
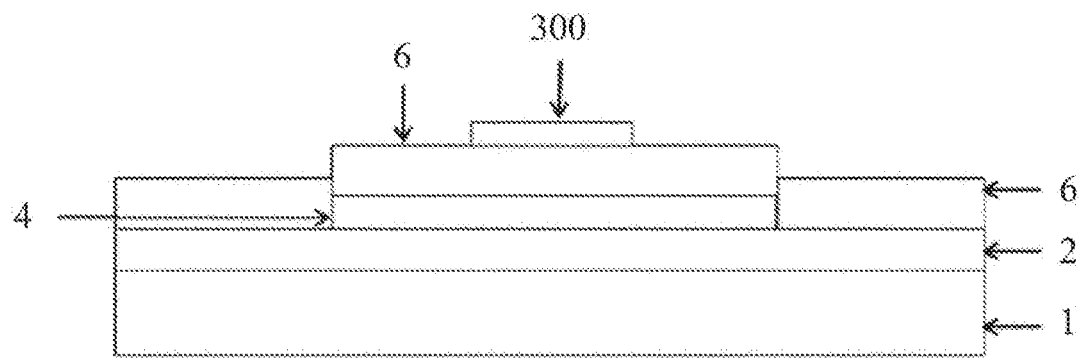
FIG. 11 is a schematic diagram illustrating a method for manufacturing a thin film transistor provided by the present disclosure.

In step S104, as shown in FIG. 11, a gate insulating layer 6 is formed on the polysilicon active layer 4.

The gate insulating layer 6 is formed as follows: removing the photoresist pattern 5 on the polysilicon active layer 4 by a photoresist stripping process, depositing a silicon dioxide film or a composite film of silicon dioxide and silicon nitride by adopting a plasma enhanced chemical vapor deposition process, and forming the gate insulating layer 6 on the polysilicon active layer 4.

In this step, the insulating material of the gate insulating layer 6 may be filled in the above-described, for example, rectangular via hole in the same step of forming the gate insulating layer 6.

The present disclosure is not limited thereto, and for example, the method for manufacturing the thin film transistor of the present disclosure may include a separate step of filling the via hole. For example, before forming the gate insulating layer 6, the method for manufacturing the thin film transistor includes filling the via hole with the insulating material; after this step, the method for manufacturing the thin film transistor may further include a step of planarizing the filled insulating material. By doing so, it is possible to avoid excessive current flowing through the ends of the first electrode strips and/or the ends of the second electrode strips.

In step S105, as shown in FIG. 11, a gate electrode 300 is formed on the gate insulating layer 6.

The gate electrode 300 may be formed as follows: one or more low-resistance metal material films are deposited on the gate insulating layer 6 by a physical vapor deposition method such as magnetron sputtering, and then the gate electrode 300 is formed by a photolithography process. The metal material film may be a single-layer metal film of aluminum, copper, molybdenum, titanium, aluminum-neodymium alloy or the like, or a multilayer metal film of molybdenum/aluminum/molybdenum, titanium/aluminum/titanium or the like.

In step S106, as shown in FIG. 11, an ion implantation process is performed on the polysilicon active layer 4 to form a source electrode contact region and a drain electrode contact region.

The source electrode contact region and the drain electrode contact region may be formed as follows: the ion implantation process is performed on the polysilicon active layer 4 with the gate electrode 300 used as an ion implantation blocking layer, so that the source electrode contact region and the drain electrode contact region with low resistance is formed in a region of the polysilicon active layer which is not blocked by the gate electrode 300.

Figure 12:
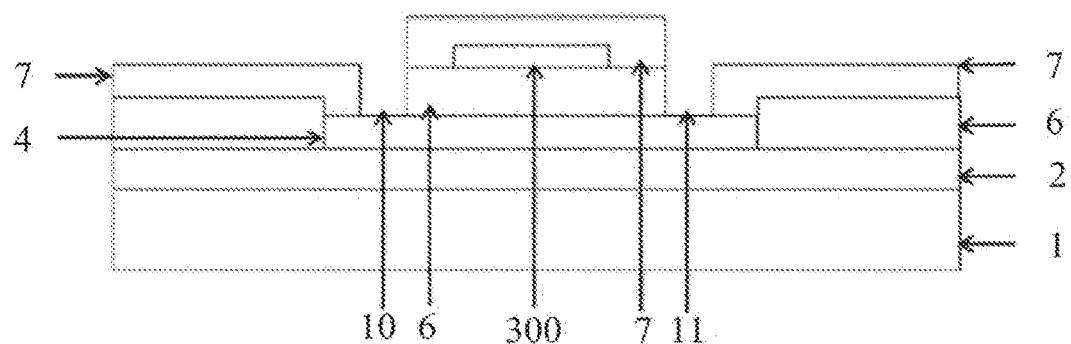
FIG. 12 is a schematic diagram illustrating a method for manufacturing a thin film transistor provided by the present disclosure.

In step S107, as shown in FIG. 12, an interlayer insulating layer 7 is formed, and a source electrode contact hole 10 and a drain electrode contact hole 11 are formed in the interlayer insulating layer 7.

The interlayer insulating layer 7, the source electrode contact hole 10 and the drain electrode contact hole 11 may be formed as follows: on an entire surface including a surface of the gate electrode 300, a silicon nitride film and a silicon dioxide film are sequentially formed by a plasma enhanced chemical vapor deposition process to obtain the interlayer insulating layer 7, and the interlayer insulating layer 7 is etched by a mask and etching process to form the source electrode contact hole 10 and the drain electrode contact hole 11.

Figure 13:
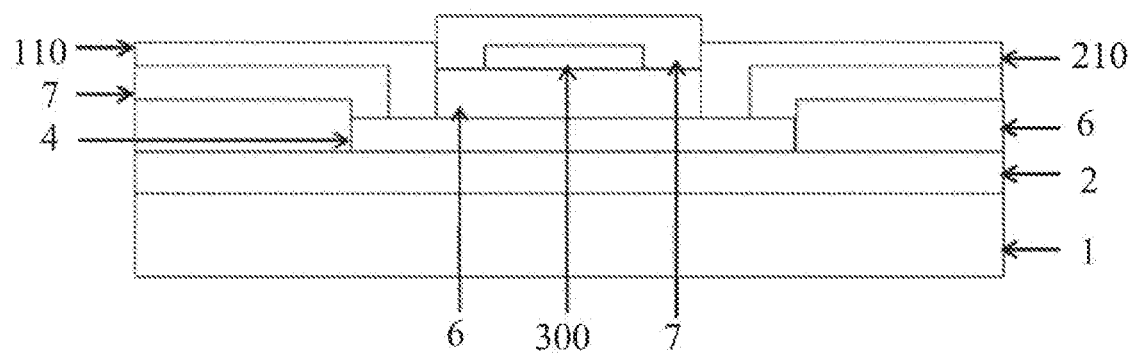
FIG. 13 is a schematic diagram illustrating a method for manufacturing a thin film transistor provided by the present disclosure.

In step S108, as shown in FIG. 13, a first electrode strip 110 and a second electrode strip 210 are formed on the interlayer insulating layer 7, and ions doped in the polysilicon active layer 4 are activated.

The procedure of forming the first electrode strip 110 and the second electrode strip 210 and activating the ions doped in the polysilicon active layer 4 may include: one or more low-resistance metal films are deposited on the interlayer insulating layer 7 by magnetron sputtering, the first electrode strip 110 and the second electrode strip 210 are formed by a mask and etching process, and the first electrode strip 110 and the second electrode strip 210 form ohmic contact with the polysilicon active layer 4 through the source electrode contact hole 10 and the drain electrode contact hole 11. Ions doped in the polysilicon active layer 4 are activated by a rapid thermal annealing or heat-treatment furnace annealing process to form an effective conductive channel in the polysilicon active layer 4 under the gate electrode 300. The low-resistance metal film may be a single-layer metal film of aluminum, copper, molybdenum, titanium, aluminum-neodymium alloy, or the like, or a multi-layer metal film of molybdenum/aluminum/molybdenum, titanium/aluminum/titanium, or the like.

Figure 14:
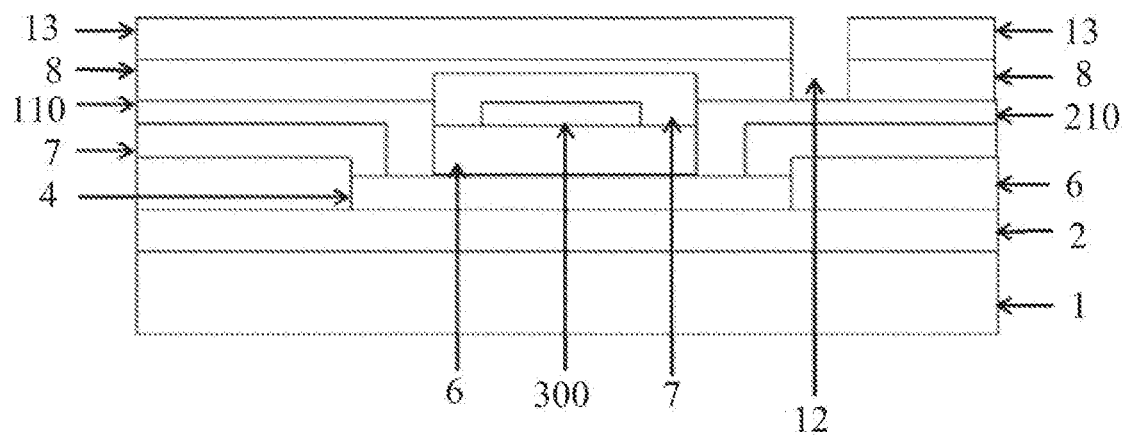
FIG. 14 is a schematic diagram illustrating a method for manufacturing a thin film transistor provided by the present disclosure.

In step S109, as shown in FIG. 14, a passivation layer 8 and a planarization layer 13, and a via hole 12 penetrating through the passivation layer 8 and the planarization layer 13 are formed.

The passivation layer 8 and the planarization layer 13, and the via hole 12 penetrating through the passivation layer 8 and the planarization layer 13 are formed as follows: a silicon nitride film is deposited on an entire surface including surfaces of the first electrode strip 110 and the second electrode strip 210 by a plasma enhanced chemical vapor deposition process, and the passivation layer 8 including a portion of the via hole 12 is formed through a masking and etching process. A hydrogenation process is performed by using a rapid thermal annealing or heat-treatment furnace process to repair defects in the polysilicon active layer 4 and at an interface of the polysilicon active layer 4. Again with a masking process, the planarization layer 13 having a via hole of the same shape as in the passivation layer 8 is formed on the passivation layer 8, with an organic material.

Figure 15:
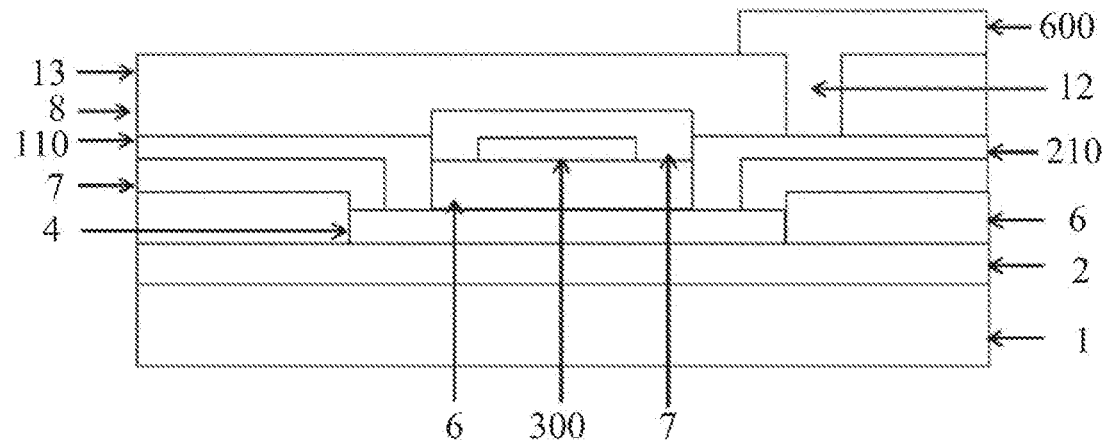
FIG. 15 is a schematic diagram illustrating a method for manufacturing a thin film transistor provided by the present disclosure.

In step S110, as shown in FIG. 15, a pixel electrode 600 is formed on the planarization layer 13, and the pixel electrode 600 is electrically coupled to the second electrode strip 210 through the via hole 12.

Particularly, a transparent conductive film is deposited on the planarization layer 13 by a magnetron sputtering process such that the pixel electrode 600 is formed in the via hole 12 and on a part of the planarization layer 13. The transparent conductive film may be a single-layer conductive oxide film, such as Indium Tin Oxide (ITO) or Indium Zinc Oxide (IZO), or may be a composite film of indium tin oxide/silver/indium tin oxide, indium zinc oxide/silver, or the like.

Figure 16:
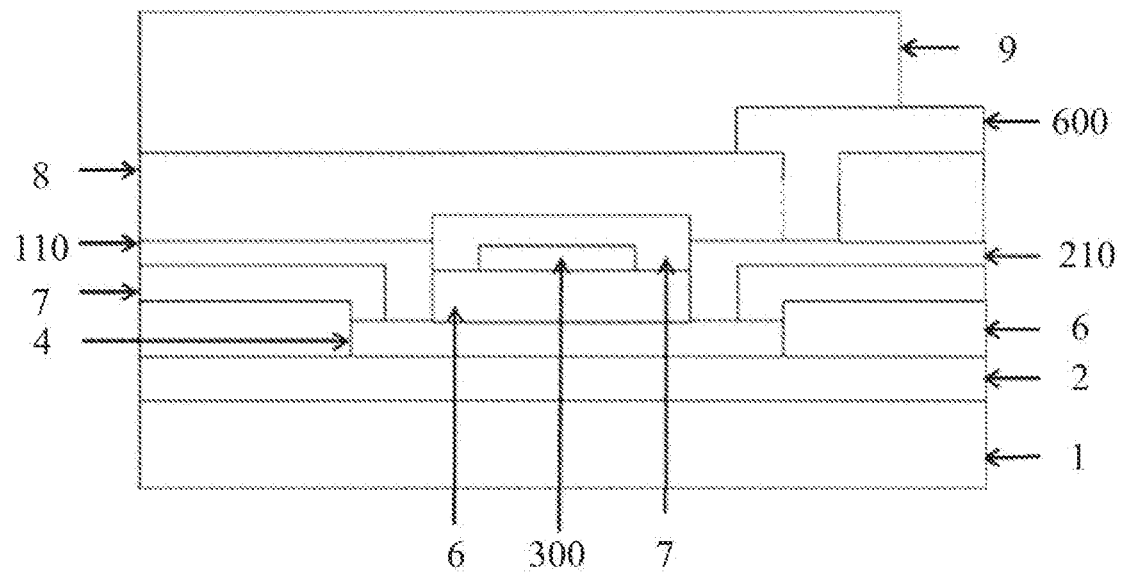
FIG. 16 is a schematic diagram illustrating a method for manufacturing a thin film transistor provided by the present disclosure.

Step S111, as shown in FIG. 16, a pixel definition layer 9 is formed.

The pixel definition layer 9 may be formed as follows: a layer of a photosensitive organic material similar to the organic material of the planarization layer 13 is coated on the planarization layer 13 and the pixel electrode 600, and a part of the pixel electrode 600 is exposed through a final mask process, thereby forming the pixel defining layer 9 covering the planarization layer 13 and a part of the pixel electrode 600.

Table 1-1 shows an embodiment of a material and a thickness of each film or layer in the thin film transistor provided in the present disclosure:

TABLE 1-1

| Film or Layer | Material | Thickness/Å |
|---|---|---|
| Polyimide film I | Polyimide resin | 90000 |
| Barrier layer I (BarrierI) | Silicon oxide (buffer layer) | 5000 |
| Polyimide film II | Polyimide resin | 50000 |
| Barrier layer II (BarrierII) | Silicon oxide (buffer layer) | 5000 |
| Buffer layer (Buffer) | Silicon nitride/silicon oxide | 3500 |
| Polysilicon active layer 4 | Polycrystalline silicon | 600 |
| Gate insulating layer 6 | Silicon oxide | 1200 |
| Gate electrode 300 | Molybdenum (Mo) | 2500 |
| Interlayer insulating layer 7 | Silicon nitride/silicon oxide | 4500 |
| Source/drain electrode layer | Titanium/aluminium/titanium | 8000 |
| Passivation layer 8 | Silicon nitride | 2500 |
| Planarization layer 13 | Polyimide resin | 12000 |
| Pixel electrode 600 | Indium tin oxide/silver/indium tin oxide | 1000 |

In the table 1-1, the polyimide film I, the barrier layer I, the polyimide film II, the barrier layer II, and the buffer layer are all the films or layers in the substrate 1.

It will be understood that, the above embodiments are merely exemplary embodiments employed to illustrate the principles of the present disclosure, and the present disclosure is not limited thereto. It will be apparent to those skilled in the art that various changes and modifications can be made without departing from the spirit and scope of the disclosure, and these changes and modifications are to be considered within the scope of the disclosure.

What is claimed is:

1. A thin film transistor, comprising an active layer and a source-drain electrode layer, wherein the active layer is made of a semiconductor material, the source-drain electrode layer comprises a first electrode and a second electrode, the first electrode comprises at least one first electrode strip, the second electrode comprises at least one second electrode strip, the at least one first electrode strip and the at least one second electrode strip are alternately arranged at intervals,
    at least an insulating part of a layer where the active layer is located is provided with an insulating material, and the insulating part is located at an orthographic projection of at least a part of a region between a free end of the first electrode strip, which is proximal to the second electrode, and the second electrode, on the layer where the active layer is located; and/or
    at least an insulating part of a layer where the active layer is located is provided with an insulating material, and the insulating part is located at an orthographic projection of at least a part of a region between a free end of the second electrode strip, which is proximal to the first electrode, and the first electrode, on the layer where the active layer is located.

2. The thin film transistor of claim 1, wherein the first electrode further comprises at least one first conductive connecting strip, the first electrode comprises a plurality of first electrode strips, and the plurality of first electrode strips of the first electrode are electrically coupled to each other by the first conductive connecting strip.

3. The thin film transistor of claim 2, wherein the second electrode comprises at least one second conductive connecting strip, the second electrode comprises a plurality of second electrode strips, and the plurality of second electrode strips of the second electrode are electrically coupled to each other by the at least one second conductive connecting strip; and
    the at least one first conductive connecting strip and the at least one second conductive connecting strip are arranged in parallel.

4. The thin film transistor of claim 3, wherein the at least one first conductive connecting strip comprises one first conductive connecting strip and the at least one second conductive connecting strip comprises two second conductive connecting strips;
    the two second conductive connecting strips are respectively arranged on two sides of the first conductive connecting strip; and
    the plurality of first electrode strips are arranged on two sides of the first conductive connecting strip, and the plurality of second electrode strips are respectively arranged on one side, facing the first conductive connecting strip, of the two second conductive connecting strips.

5. The thin film transistor of claim 4, wherein at least an insulating part of a layer where the active layer is located is provided with an insulating material, and the insulating part is located at an orthographic projection of at least a part of a region between a free end of the first electrode strip, which is proximal to the second electrode, and its opposite second conductive connecting strip, on the layer where the active layer is located; and/or at least an insulating part of a layer where the active layer is located is provided with an insulating material, and the insulating part is located at an orthographic projection of at least a part of a region between a free end of the second electrode strip, which is proximal to the first electrode, and the first conductive connecting strip, on the layer where the active layer is located.

6. The thin film transistor of claim 5, wherein a region of the layer where the active layer is located is provided with an insulating material, the region is within a first predetermined distance from an orthographic projection of at least one of two sides of the first conductive connecting strip on the layer where the active layer is located, and the first predetermined distance is a distance between a free end of the second electrode strip and its opposite first conductive connecting strip; and/or a region of the layer where the active layer is located is provided with an insulating material, the region is within a second predetermined distance from an orthographic projection of a side, proximal to the first conductive connecting strip, of at least one of the two conductive connecting strips on the layer where the active layer is located, and the second predetermined distance is a distance between a free end of the first electrode strip and its opposite second conductive connecting strip.

7. The thin film transistor of claim 6, further comprising a conductive strip, wherein the two second conductive connecting strips are electrically coupled to the conductive strip on one side of a direction in which the two second conductive connecting strips extend.

8. The thin film transistor of claim 2, wherein the first electrode comprises one first conductive connecting strip and four first electrode strips, two first electrode strips of the four first electrode strips are arranged on one side of the first conductive connecting strip, and the other two first electrode strips of the four first electrode strips are arranged on the other side of the first conductive connecting strip; and the second electrode comprises two second electrode strips, the two second electrode strips are respectively arranged on two sides of the first conductive connecting strip, and each of the two second electrode strips is inserted between the two first electrode strips on its side.

9. The thin film transistor of claim 8, wherein a part of the layer where the active layer is located corresponding to an orthographic projection of at least a portion of a region between the second electrode strip and the first conductive connecting strip thereon is provided with an insulating material.

10. The thin film transistor of claim 1, wherein the orthographic projection of at least a part of a region between a free end of the first electrode strip, which is proximal to the second electrode, and the second electrode, on the layer where the active layer is located and/or the orthographic projection of at least a part of a region between a free end of the second electrode strip, which is proximal to the first electrode, and the first electrode, on the layer where the active layer is located is a rectangular orthographic projection.

11. The thin film transistor of claim 10, further comprising a gate electrode, an orthogonal projection of which on the layer where the active layer is located partially overlaps with the rectangular orthogonal projection.

12. The thin film transistor of claim 1, further comprising a gate insulating layer of a same material as the insulating material.

13. A display panel, comprising a plurality of thin film transistors, wherein at least one thin film transistor of the plurality of thin film transistors is the thin film transistor of claim 1.

14. The display panel of claim 13, comprising a plurality of pixel units, wherein, at least one of the plurality of pixel units comprises a pixel circuit having the at least one thin film transistor, and the first electrode functions as a source electrode and the second electrode functions as a drain electrode.

15. The display panel of claim 14, wherein the first electrode comprises one first conductive connecting strip and four first electrode strips, two first electrode strips of the four first electrode strips are arranged on one side of the first conductive connecting strip, and the other two first electrode strips of the four first electrode strips are arranged on the other side of the first conductive connecting strip; and the second electrode comprises two second electrode strips, the two second electrode strips are respectively arranged on two sides of the first conductive connecting strip, and each of the two second electrode strips is inserted between the two first electrode strips on its side; and the first electrode is electrically coupled to a data line by the first conductive connecting strip, and the second electrode is electrically coupled to a pixel electrode by a conductive part.

16. The display panel of claim 13, further comprising a gate drive circuit comprising a plurality of cascaded shift register units, which comprise the at least one thin film transistor; and the second electrode functions as a source electrode, and the first electrode functions as a drain electrode.

17. A method for manufacturing the thin film transistor of claim 1, comprising:

forming a pattern of an active layer on a substrate, so that at least an insulating part of a layer where the active layer is located is provided with an insulating material, and the insulating part is located at an orthographic projection of at least a part of a region between a free end of the first electrode strip, which is proximal to the second electrode, and the second electrode, on the layer where the active layer is located; and/or at least an insulating part of a layer where the active layer is located is provided with an insulating material, and the insulating part is located at an orthographic projection of at least a part of a region between a free end of the second electrode strip, which is proximal to the first electrode, and the first electrode, on the layer where the active layer is located.

18. The method of claim 17, wherein, the forming a pattern of an active layer on a substrate comprises forming a semiconductor material layer on the substrate, and forming a via hole in the semiconductor material layer at at least the insulating part of the layer where the active layer is located by a patterning process; and the method further comprises filling the via hole with the insulating material, flattening the insulating material in the via hole and forming a gate insulating layer.

19. The method of claim 17, wherein, the forming a pattern of an active layer on a substrate comprises forming a semiconductor material layer on the substrate, and forming a via hole in the semiconductor material layer at at least the insulating part of the layer where the active layer is located by a patterning process; and the method further comprises depositing a gate insulating layer material directly after forming the via hole to form a pattern of a gate insulating layer while filling the via hole with the gate insulating layer material.

\* \* \* \* \*